United States Patent
Ma et al.

(10) Patent No.: US 11,469,077 B2
(45) Date of Patent: Oct. 11, 2022

(54) MICROWAVE PLASMA CHEMICAL VAPOR DEPOSITION DEVICE AND APPLICATION THEREOF

(71) Applicant: FD3M, Inc., San Francisco, CA (US)

(72) Inventors: Yi Ma, Sammamish, WA (US); Matthew L. Scullin, San Francisco, CA (US); Jinhua Zhu, Suzhou (CN); Jianxin Wu, Suzhou (CN); Yong Miao, Suzhou (CN); Di Lu, Suzhou (CN); Yonggan Ai, Suzhou (CN); Christopher E. Griffin, San Francisco, CA (US)

(73) Assignee: FD3M, Inc., San Francisco, CA (US)

( * ) Notice: Subject to any disclaimer, the term of this patent is extended or adjusted under 35 U.S.C. 154(b) by 172 days.

(21) Appl. No.: 16/390,526

(22) Filed: Apr. 22, 2019

(65) Prior Publication Data
US 2019/0326097 A1 Oct. 24, 2019

Related U.S. Application Data

(60) Provisional application No. 62/661,805, filed on Apr. 24, 2018, provisional application No. 62/661,809, (Continued)

(51) Int. Cl.
*H01J 37/32* (2006.01)
*C23C 16/27* (2006.01)
*C23C 16/511* (2006.01)

(52) U.S. Cl.
CPC ...... *H01J 37/32229* (2013.01); *C23C 16/274* (2013.01); *C23C 16/511* (2013.01);
(Continued)

(58) Field of Classification Search
USPC .............................. 118/723 MW; 156/345.41
See application file for complete search history.

(56) References Cited

U.S. PATENT DOCUMENTS 3,814,983 A * 6/1974 Weissfloch ............... H05H 1/46
315/39
4,877,642 A * 10/1989 Gartner ................. C23C 16/511
427/575
(Continued)

FOREIGN PATENT DOCUMENTS

CN 101311341 A 4/2010
CN 103322217 A 9/2013
(Continued)

OTHER PUBLICATIONS

Machine Translation CN104726850, Wang et al (Year: 2015).*
(Continued)

*Primary Examiner* — Ram N Kackar
(74) *Attorney, Agent, or Firm* — Temmerman Law; Mathew J. Temmerman

(57) ABSTRACT

A microwave plasma chemical vapor deposition device for diamond synthesis. A microwave source generates a microwave signal, and a resonant cavity receives a plurality of process gases. The microwave signal is spread in a first mode at a first waveguide. A mode conversion antenna converts the first mode of the microwave signal into a second mode that is spread at a second waveguide. A coupling conversion cavity receives and transmits the microwave signal in the second mode to the mode conversion antenna thereby converting the second mode of the microwave signal into a third mode. A medium viewport receives the microwave signal in the third mode and transmits to the resonant cavity which enables the microwave signal to excite and discharge the process gases to form spherical
(Continued)

plasma, carbon containing groups and atomic hydrogen thereby depositing a diamond film on a seed.

7 Claims, 11 Drawing Sheets

Related U.S. Application Data filed on Apr. 24, 2018, provisional application No. 62/661,806, filed on Apr. 24, 2018, provisional application No. 62/661,811, filed on Apr. 24, 2018, provisional application No. 62/661,807, filed on Apr. 24, 2018.

(52) U.S. Cl.
CPC .... *H01J 37/3222* (2013.01); *H01J 37/32247* (2013.01); *H01J 2237/3321* (2013.01)

(56) References Cited

U.S. PATENT DOCUMENTS

| | | | | |
|---|---|---|---|---|
| 6,077,787 | A * | 6/2000 | Reinhard | H01J 37/32192 216/38 |
| 6,158,383 | A * | 12/2000 | Watanabe | H01J 37/32192 118/723 AN |
| 10,530,046 | B2 * | 1/2020 | Nishioka | H01Q 5/378 |
| 2004/0011465 | A1 * | 1/2004 | Matsumoto | H01J 37/32192 156/345.41 |
| 2004/0069232 | A1 * | 4/2004 | Huang | H01J 37/32229 118/723 MW |
| 2004/0168768 | A1 * | 9/2004 | Nozawa | C23C 16/4405 156/345.29 |
| 2008/0011232 | A1 * | 1/2008 | Rius | C23C 16/511 118/733 |
| 2009/0239078 | A1 * | 9/2009 | Asmussen | C30B 25/08 428/408 |
| 2010/0006227 | A1 * | 1/2010 | Radoui | H01J 37/32192 156/345.41 |
| 2010/0034984 | A1 | 2/2010 | Asmussen et al. | |
| 2011/0014112 | A1 | 1/2011 | Misra | |
| 2012/0247675 | A1 * | 10/2012 | Ikeda | H01J 37/32211 156/345.34 |
| 2013/0239615 | A1 | 9/2013 | Misra | |
| 2013/0272928 | A1 | 10/2013 | Misra | |
| 2014/0220261 | A1 * | 8/2014 | Asmussen | C30B 25/105 427/570 |
| 2014/0230729 | A1 | 8/2014 | Brandon et al. | |
| 2015/0240383 | A1 | 8/2015 | Misra | |
| 2015/0348757 | A1 * | 12/2015 | Stowell | H01J 37/32238 315/39 |
| 2016/0201221 | A1 | 6/2016 | Misra et al. | |
| 2016/0333497 | A1 | 11/2016 | Misra | |
| 2017/0253963 | A1 | 9/2017 | Sabens et al. | |
| 2017/0298515 | A1 | 10/2017 | Sabens et al. | |
| 2021/0087676 | A1 * | 3/2021 | Gicquel | C23C 16/274 |

FOREIGN PATENT DOCUMENTS

| | | | |
|---|---|---|---|
| CN | 103526187 | A | 1/2014 |
| CN | 103710748 | A | 4/2014 |
| CN | 102337583 | A | 1/2015 |
| CN | 104726850 | * | 6/2015 |
| CN | 103695865 | A | 6/2016 |
| CN | 104164658 | A | 8/2016 |
| CN | 206529521 | A | 9/2017 |
| CN | 206609299 | U | 11/2017 |
| CN | 107740064 | A | 2/2018 |
| CN | 106811737 | A | 5/2019 |
| CN | 107112190 | A | 7/2019 |
| JP | 2000054142 | A | 2/2000 |

OTHER PUBLICATIONS

CNIPA, Office Action 1 for Chinese patent application 201810408777X, dated Apr. 7, 2020.
CNIPA, Office Action 2 for Chinese patent application 201810408777X, dated Sep. 29, 2020.
CNIPA, Office Action 1 for Chinese patent application 2018104086368, dated Mar. 27, 2020.
CNIPA, Office Action 2 for Chinese patent application 2018104086368, dated Dec. 10, 2020.
CNIPA, Office Action for Chinese patent application 2018104087002, dated Mar. 27, 2020.
CNIPA, Office Action 1 for Chinese patent application 2018104087074, dated Apr. 24, 2020.
CNIPA, Office Action 2 for Chinese patent application 2018104087106, dated Apr. 8, 2020.
CNIPA, Office Action 1 for Chinese patent application 2018104087074, dated Sep. 22, 2020.

\* cited by examiner

MICROWAVE PLASMA CHEMICAL VAPOR DEPOSITION DEVICE AND APPLICATION THEREOF

RELATED APPLICATIONS

This application claims priority from the U.S. provisional application Ser. No. 62/661,805 filed Apr. 24, 2018, from the U.S. provisional application Ser. No. 62/661,806 filed Apr. 24, 2018, from the U.S. provisional application Ser. No. 62/661,807 filed Apr. 24, 2018, from the U.S. provisional application Ser. No. 62/661,809 filed Apr. 24, 2018, from the U.S. provisional application Ser. No. 62/661,811 filed Apr. 24, 2018. The disclosures of these provisional are incorporated herein as if set out in full.

BACKGROUND OF THE DISCLOSURE

Technical Field of the Disclosure

The present embodiment relates generally to methods for synthesis of a single crystal diamond, and more particularly, to a method for creating a diamond film by excitation and discharge of a plurality of process gases utilizing a vacuum pressure control device and a plasma coupling device in a microwave plasma chemical vapor deposition device.

Description of the Related Art

Diamonds are widely utilized in various industrial and civil fields because of their excellent physical and chemical properties. Due to their rarity and expense, several methods have been implemented for artificially synthesizing diamonds. These methods include high temperature high pressure (HTHP) processes, direct current arc plasma jet (DCAPJ) processes, hot-wire chemical vapor deposition (HFCVD) processes and microwave plasma chemical vapor deposition (MPCVD) processes. Among these methods, MPCVD is preferred for preparing a high-quality diamond as the microwave excited plasmas have a series of advantages including good controllability, high plasma density and less electrode pollution. Due to the wide range of advantages, different types of MPCVD processes have been developed in the art. The primary differences among these various MPCVD devices and methods are that they are based on different types of plasma reaction chambers. For instance, in the case of vacuum deposition chambers, there are quartz type, quartz bell jar type and a metal cavity type having a microwave viewport. Further, in the case of coupling manners of microwaves and plasmas, there are surface wave coupling types, direct coupling types and an antenna coupling types. In the antenna coupling type, a metal antenna is generally implemented, however, it has the drawback of low efficiency. Since plasma excitation is formed in a resonant cavity, regulation of pressure of the resonant cavity is crucial to the synthesis of quality diamonds. In existing MPCVD devices, a proportioning valve for regulating the size of a valve core is generally arranged on a vacuum pipe to control the pressure of the resonant cavity. However, this proportioning valve is expensive, requires an ultrahigh vacuum, and is not capable of regulating pressure in a precise manner.

Conventional MPCVD diamond synthesis processes have considerable drawbacks, for example, difficulties of high temperature, easy corrosion, vacuuming degrees, cleanliness and the like. Several MPCVD methods have been developed to overcome the above-mentioned limitations. One such method describes a synthesis of a single crystal diamond grown by microwave plasma chemical vapor deposition annealed at pressures in excess of 4.0 GPa and heated to temperature in excess of 1500 degrees C. that has a hardness of greater than 120 GPa. However, this method does not exhibit a high temperature resistance feature as there is no cooling means included in the microwave plasma chemical vapor deposition reactor.

Another method for producing diamonds by microwave plasma-assisted chemical vapor deposition comprises providing a substrate and establishing a microwave plasma ball in an atmosphere comprising hydrogen, a carbon source and oxygen at a pressure and temperature sufficient to cause the deposition of diamond on the substrate. However, this method of producing diamonds does not possess a pressure regulation component. Hence, it is not possible to regulate the microwave plasma-assisted chemical vapor deposition device at different pressures. Further, this diamond synthesis device includes complex components which increases the manufacturing and maintenance cost.

Yet another method provides an apparatus for producing diamond in a deposition chamber including a heat-sinking holder, a non-contact temperature measurement device positioned to measure temperature of the diamond and a main process controller for receiving a temperature measurement from the non-contact temperature measurement device and controlling temperature of the growth surface. This diamond producing apparatus does not include a leak protection method to detect and solve possible leakages in the apparatus.

Therefore, there is a need for an efficient device and method for synthesizing diamonds. Such a needed method would include a microwave plasma chemical vapor deposition device for synthesizing diamond with an effective cooling means adaptable to provide high temperature resistance. Further, such a method would reduce the perturbation effect on the electromagnetic waves thereby improving stability of the plasma material. Moreover, such a needed method would possess a cost effective pressure regulation device adaptable to regulate the diamond synthesizing device at different pressure levels with high precision. Further, such a needed method would include simple and cost effective functional components to reduce maintenance cost. Moreover, such a needed device would possess a leak detection method to detect and prevent possible leakage thereby improving the quality of a resultant diamond. Such a needed device would implement reliable and efficient types of antenna coupling manners. The present embodiment overcomes shortcomings in the field by accomplishing these critical objectives.

SUMMARY OF THE DISCLOSURE

To minimize the limitations found in the prior art, and to minimize other limitations that will be apparent upon the reading of the specification, the preferred embodiment of the present invention provides a microwave plasma chemical vapor deposition device to synthesize a diamond film. The microwave plasma chemical vapor deposition device comprises a microwave source, resonant device, a vacuum pressure control device and a plasma coupling device. The microwave source generates a microwave signal. The resonant device includes a resonant cavity and a deposition station. The resonant cavity is adaptable to receive a plurality of process gases including methane and hydrogen. The vacuum pressure control device designed to vacuumize the resonant cavity. The vacuum pressure control device includes a first vacuum pipe and a second vacuum pipe communicated between a vacuumizing interface and a vacuum pump. The plasma coupling device includes a waveguide, a mode conversion antenna, a coupling conversion cavity and a medium viewport.

The waveguide connected to the microwave source includes a first waveguide and a second waveguide. The microwave signal is spread in a TE10 mode at the first waveguide. The mode conversion antenna is connected to the waveguide. The mode conversion antenna converts the TE10 mode of the microwave signal into a TEM mode that being spread at the second waveguide. The coupling conversion cavity is arranged above the resonant cavity and connected to the mode conversion antenna. The coupling conversion cavity receives and transmits the microwave signal in the TEM mode to the mode conversion antenna under controlled temperature via the second waveguide thereby converting the TEM mode of the microwave signal into a TM01 mode. The medium viewport is located between the resonant cavity and the coupling conversion cavity. The medium viewport receives the microwave signal in the TM01 mode and sends to the vacuumized resonant cavity which enables methane above the deposition station to form carbon containing groups, atomic hydrogen and spherical plasma utilizing an optimum voltage level thereby depositing and obtaining the diamond film on an upper surface of a seed.

The TM01 mode of the microwave signal enables a region above the deposition station to form an electromagnetic field having highest intensity and benefits excitation of the plasma material thereby preventing a side wall of the resonant cavity from polluting the deposited diamond film. The medium viewport includes a cooling cavity, a plurality of gas inlets and a plurality of gas outlets communicated with the cooling cavity. The vacuum pressure control device includes a first vacuum pipe and a second vacuum pipe. The first vacuum pipe and the second vacuum pipe are communicated between a vacuumizing interface and a vacuum pump. The first vacuum pipe of the vacuum pressure control device is provided with a first valve. The second vacuum pipe is provided with a second valve and a proportioning valve. The proportioning valve includes a proportioning seal plate and a through hole having a fixed diameter and formed on the proportioning seal plate. The plurality of process gases enters the resonant cavity through a vortex intake manner. The coupling conversion cavity is subjected to temperature control by virtue of a water cooling manner. The microwave plasma chemical vapor deposition device further comprises a tuner arranged between the first waveguide and the microwave source. The transition waveguide is arranged between the tuner and the first waveguide. The optimum voltage applied to two ends of the mode conversion antenna ranges between 1000V and 1200V.

The preferred embodiment provides a method for synthesizing the diamond film utilizing the microwave plasma chemical vapor deposition device. The method commences by providing the microwave plasma chemical vapor deposition device. Next, the resonant cavity is vacuumized and a plurality of process gases including methane and hydrogen are introduced into the resonant cavity. The microwave signal is generated by the microwave source. The microwave signal in a first mode is spread at a first waveguide. The microwave signal in a second mode is spread at the second waveguide after being converted via the mode conversion antenna. The second mode of the microwave signal is converted into the third mode by the mode conversion antenna after transmitting to the coupling conversion cavity via the second waveguide. The microwave signal in the third mode is sent to the resonant cavity via a medium viewport at the plasma coupling device. The methane in the plurality of process gases above a deposition station is excited and discharged to form carbon containing groups, atomic hydrogen and the plasma material at an optimum voltage and pressure condition thereby depositing and obtaining the diamond film on the upper surface of the seed.

A first objective of the present invention is to provide a method for synthesizing a diamond film utilizing a microwave plasma chemical vapor deposition device.

A second objective of the present invention is to provide a microwave plasma chemical vapor deposition device having an effective cooling means adaptable to provide high temperature resistance.

A third objective of the present invention is to provide a microwave plasma chemical vapor deposition device that reduces the perturbation effect on the electromagnetic waves thereby improving stability of the plasma material.

A fourth objective of the present invention is to provide a microwave plasma chemical vapor deposition device that possesses a cost effective pressure regulation device adaptable to regulate the diamond synthesizing device at different pressure levels with high precision.

A fifth objective of the present invention is to provide a microwave plasma chemical vapor deposition device that includes simple and cost effective functional components to reduce maintenance cost.

A sixth objective of the present invention is to provide a microwave plasma chemical vapor deposition device having a leak detection method to detect and prevent possible leakages thereby improving the quality of diamond.

Another objective of the present invention is to provide a microwave plasma chemical vapor deposition device that implements reliable and efficient type of antenna coupling manner.

These and other advantages and features of the present invention are described with specificity so as to make the present invention understandable to one of ordinary skill in the art.

BRIEF DESCRIPTION OF THE DRAWINGS

Elements in the figures have not necessarily been drawn to scale in order to enhance their clarity and improve understanding of these various elements and embodiments of the invention. Furthermore, elements that are known to be common and well understood to those in the industry are not depicted in order to provide a clear view of the various embodiments of the invention, thus the drawings are generalized in form in the interest of clarity and conciseness.

DETAILED DESCRIPTION OF THE DRAWINGS

In the following discussion that addresses a number of embodiments and applications of the present invention, reference is made to the accompanying drawings that form a part hereof, and in which is shown by way of illustration specific embodiments in which the invention may be practiced. It is to be understood that other embodiments may be utilized, and changes may be made without departing from the scope of the present invention.

Various inventive features are described below that can each be used independently of one another or in combination with other features. However, any single inventive feature may not address any of the problems discussed above or only address one of the problems discussed above. Further, one or more of the problems discussed above may not be fully addressed by any of the features described below.

As used herein, the singular forms "a", "an" and "the" include plural referents unless the context clearly dictates otherwise. "And" as used herein is interchangeably used with "or" unless expressly stated otherwise. As used herein, the term 'about" means+/−5% of the recited parameter. All embodiments of any aspect of the invention can be used in combination, unless the context clearly dictates otherwise.

Unless the context clearly requires otherwise, throughout the description and the claims, the words 'comprise', 'comprising', and the like are to be construed in an inclusive sense as opposed to an exclusive or exhaustive sense; that is to say, in the sense of "including, but not limited to". Words using the singular or plural number also include the plural and singular number, respectively. Additionally, the words "herein," "wherein", "whereas", "above," and "below" and words of similar import, when used in this application, shall refer to this application as a whole and not to any particular portions of the application.

The description of embodiments of the disclosure is not intended to be exhaustive or to limit the disclosure to the precise form disclosed. While the specific embodiments of, and examples for, the disclosure are described herein for illustrative purposes, various equivalent modifications are possible within the scope of the disclosure, as those skilled in the relevant art will recognize.

Figure 1:
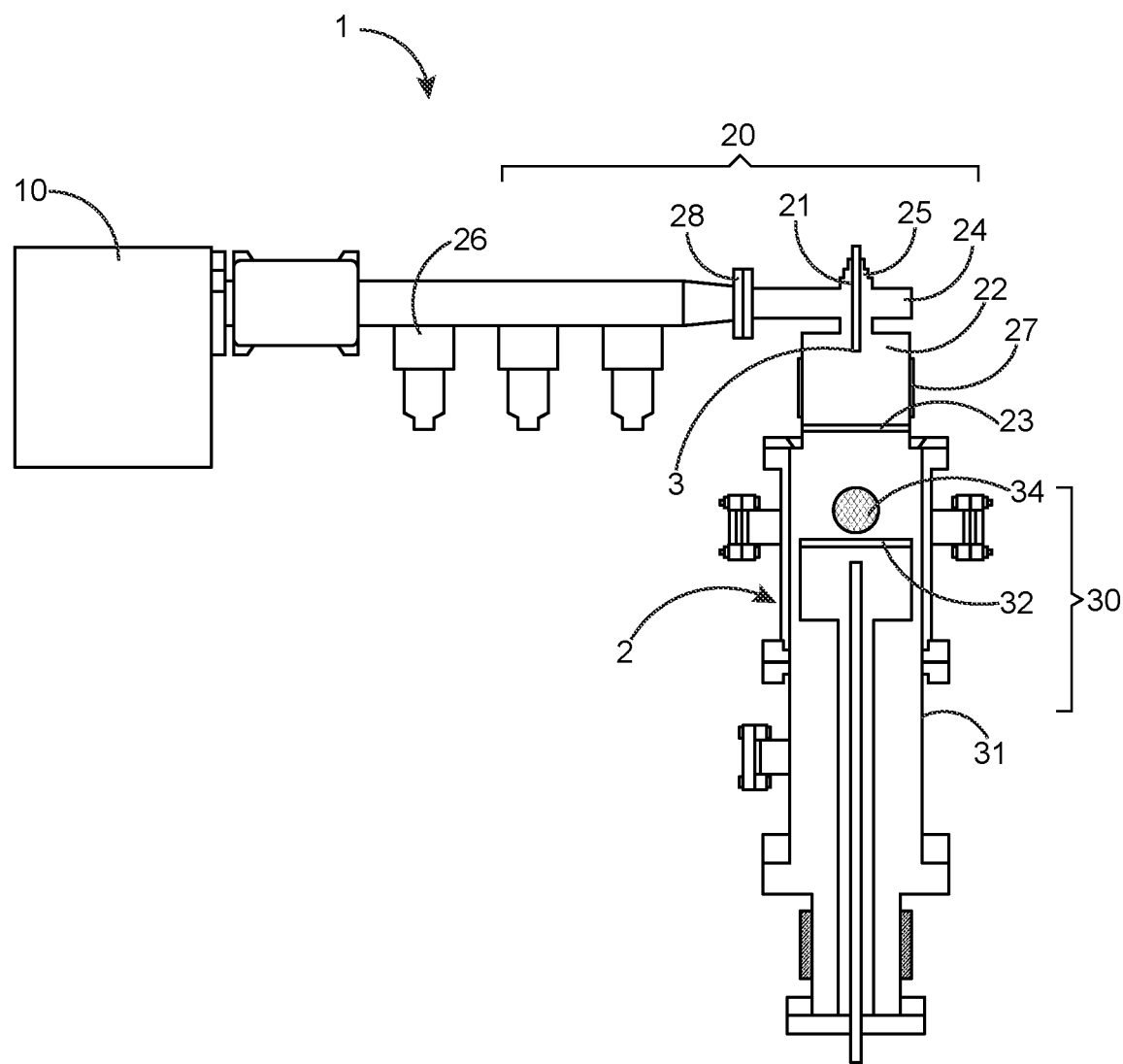
FIG. 1 shows a structural diagram of a microwave plasma chemical vapor deposition device in accordance with the preferred embodiment of the present invention.

As shown in FIG. 1, a microwave plasma chemical vapor deposition device 1 for synthesizing a diamond film is illustrated. The microwave plasma chemical vapor deposition device 1 comprises a microwave source 10, a plasma coupling device 20, a vacuum pressure control device 2 and a resonant device 30.

The microwave source 10 is used for generating microwave signals. The source may be a conventional microwave generator or other suitable apparatus as is well known the art. In existing microwave plasma chemical vapor deposition devices, the generated microwave has a power ranging from 6 KW to 75 KW and a frequency ranging from 915 MHz to 2.45 GHz. In the preferred embodiment, the microwave signal generated by the microwave source 10 has a power ranging from 6 KW to 10 KW and a frequency of 2.45 GHz.

The resonant device 30 includes a resonant cavity 31 and a deposition station 32. The shell of the resonant cavity 31 may be made of a metal material or a quartz material. In the preferred embodiment, the resonant cavity 31 is made of metal material, for example, aluminum or copper, so as to favor water cooling treatment on the resonant cavity 31. The shape of the resonant cavity 31 may be cylindrical or various other suitable shapes.

The deposition station 32 is arranged in the resonant cavity 31. The deposition station 32 comprises a substrate 321 and a cooling device 27 for cooling the substrate 33, and the cooling device 27 comprises a cooling water circuit on which is arranged a metal gasket face seal fitting, such as a VCR joint produced by Swagelok Northern California of Fremont, Calif.

The plasma coupling device 20 adopts an antenna coupling mechanism. Particularly, the plasma coupling device 20 includes a waveguide having a first waveguide 24 and a second waveguide 25, a mode conversion antenna 21, a coupling conversion cavity 22 and a medium viewport 23.

Among them, the waveguide 24, 25 is connected between the microwave source 10 and the coupling conversion cavity 22. A bottom end 3 of the mode conversion antenna 21 extends into the coupling conversion cavity 22. The coupling conversion cavity 22 is arranged above the resonant cavity 31 and the medium viewport 23 is located between the resonant cavity 31 and the coupling conversion cavity 22.

The medium viewport 23 on the top of the resonant cavity 31 is a viewport formed by a light transmitting material, for example, quartz or sapphire, which enables microwave signals to penetrate into the resonant cavity 31 and can also ensure the sealing property of the resonant cavity 31.

Under the working state, the working pressure of the coupling conversion cavity 22 is high vacuum with a pressure value ranging from 0.13 Pa to $1.3\times10^{-5}$ Pa, and the working pressure of the resonant cavity 31 is ultrahigh vacuum with a pressure value ranging from $1.3\times10^{-5}$ Pa to $1.3\times10^{-10}$ Pa.

The first waveguide 24 is a rectangular waveguide and the coupling conversion cavity 22 is a round waveguide. The second waveguide 25 is connected between the first waveguide 24 and the top end of the coupling conversion cavity 22. The second waveguide 25 is arranged perpendicular to the first waveguide 24. The mode conversion antenna 21 is arranged coaxial to the second waveguide 25. The coupling conversion cavity 22 includes a metal side wall.

The mode conversion antenna 21 converts a TE10 mode of the microwave signal in the first waveguide 24 into a TEM mode which is converted into the TM01 mode again by the mode conversion antenna 21 after being transmitted to the coupling conversion cavity 22 via the second waveguide 25 so as to enter the resonant cavity 31. Such a mode conversion mechanism prevents the TE10 mode of microwave signal from being directly converted into the TM01 mode of microwaves whose electric fields do not correspond to the TE10 mode so that the energy of the formed TM01 mode of microwaves is maximized and the use efficiency of the microwave energy is further improved. Furthermore, the TM01 mode enables a region above the deposition station 32 to form an electromagnetic field having the highest intensity. It further provides excitation of a spherical plasma 34 thereby preventing the side wall of the resonant cavity 31 from polluting the deposited diamond film.

In one embodiment, a tuner 26 is arranged between the first waveguide 24 and the microwave source 10. The tuner 26 is used for adjusting the wave forms of microwaves transmitted to the first waveguide 24 in order to match with the mode conversion antenna 21 such that the input microwave energy is maximized. For example, the tuner 26 may be a conventional three-bolt impedance tuner and the like. The three-bolt impedance tuner may be manually tuned or automatically tuned.

In one embodiment, a transition waveguide 28 is arranged between the tuner 26 and the first waveguide 24. A standard transition waveguide with a transition from WR340 to WR284 is preferably adopted.

In one embodiment, one end of the first waveguide 24 includes a cooling water tank and the lower part includes a lower pressure vacuumizing interface.

In one embodiment, the mode conversion antenna 21 is a metal coupling antenna.

In one embodiment, the coupling antenna 21 is a plasma antenna.

Figure 7:
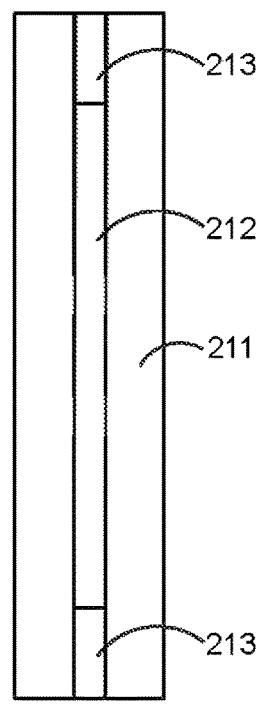
FIG. 7 illustrates a structural diagram of a coupling antenna of the microwave plasma chemical vapor deposition device in accordance with the preferred embodiment of the present invention.

The plasma antenna 21 includes quartz glass 211 (See FIG. 7), an inert gas 212 is sealed in the quartz glass, and high-voltage electrodes 213 (See FIG. 7 respectively arranged at two ends of the inert gas 212.

In the preferred embodiment, high voltages are applied to two ends of the sealed inert gas to excite the plasma to serve as the antenna, which can greatly improve the efficiency of the antenna.

Further, a voltage ranging from 1000 V to 1200 V is applied to two ends of the plasma antenna 21. Since different intake manners can affect plasma shapes, in this embodiment, process gases such as methane, carbon dioxide, oxygen and hydrogen adopt a vortex intake manner so that the plasma is maintained to be in a stable sphere state.

Particularly, the resonant cavity 31 is communicated with high-purity process gas inlets. The gas inlets enter the cavity 31 in a peripheral vortex manner and 8 to 10 holes are uniformly distributed in a peripheral direction with each hole being about 0.5 to 1 mm in diameter.

In one embodiment, the inside wall of the coupling conversion cavity 22 is provided with a water cooling device 27.

In the preferred embodiment, the side wall of the coupling conversion cavity 22 is arranged as a double-layer sandwich structure (not shown) having a sandwich space subjected to temperature control by introducing a refrigerant liquid. The refrigerant liquid operates in a circulating manner and has a water guide waterway to prevent generation of "stagnant water" in the sandwich structure.

In another embodiment, the plasma coupling device 20 adopts a surface wave coupling manner and its working principle is that a microwave passes through a circulator and the waveguide. The microwave enters a vacuum chamber through a coupling hole under the adjustment of a waveguide short-circuit piston and breaks down air at a relatively low air pressure to discharge when the power of the microwave is large enough and a high-density plasma is formed under the adjustment of the short-circuit piston.

In yet another embodiment, the plasma coupling device 20 adopts a direct coupling manner, and its working principle is that a microwave penetrates through a quartz viewport via the waveguide 24, 25 to enter a sealed vacuum and performs direct coupling and excitation under the adjustment of the short-circuit piston at the tail end of the waveguide 24, 25 to generate a plasma.

Figure 2:
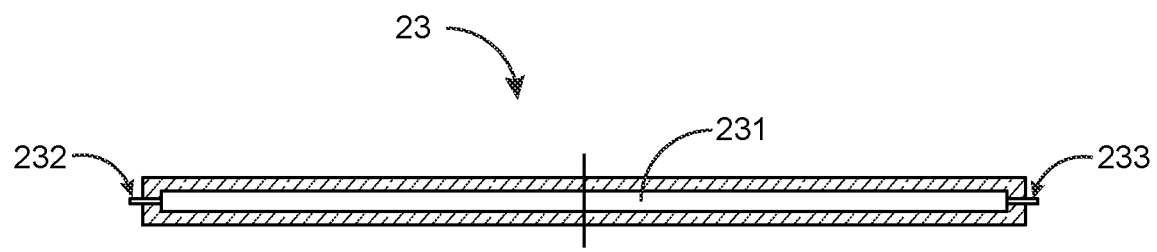
FIG. 2 shows a sectional view of a medium viewport of the microwave plasma chemical vapor deposition device in accordance with the preferred embodiment of the present invention.

As shown in FIG. 2, the medium viewport 23 has a cooling cavity 231, a viewport gas inlet 232 and a viewport gas outlet 233 communicated with the cooling cavity 231 formed in the periphery of the medium viewport 23.

Further, an inlet and an outlet of the cooling cavity 231 are communicated with the exterior of the resonant cavity 31. The cooling cavity 231 formed therebetween is independent of the resonant cavity 31 and the coupling conversion cavity 22 and thus the cooling cavity 231 does not influence pressures of the resonant cavity 31 and the coupling conversion cavity 22 when being introduced with a cooling gas.

In the preferred embodiment, the cooling of the medium viewport 23 can be achieved through flowing cooling gas and in this way high temperature resistance capability of the medium viewport 23 can be improved.

Since a cooling problem of quartz glass is solved, a low vacuum pumping problem in the waveguide 24, 25 is solved, and therefore electromagnetic waves are conducted to vacuum. A perturbation effect of the flow of the previous cooled air fluid on electromagnetic waves can also solved, greatly influencing the stabilization of the plasmas.

Further, the medium viewport 23 preferably adopts double-layer quartz glass. A sealing is formed between the quartz glass and the resonant cavity by a 1 series aluminum ring thereby achieving the sealing necessary for an ultrahigh vacuum.

Necessarily, the resonant cavity 31 is also communicated with high-purity process gas inlets. The gas inlets enter the cavity in a peripheral vortex manner, and about 8 to 10 small holes are uniformly distributed in a circumferential direction with each small hole having a diameter ranging from 0.5 to 1 mm. Gases adopt a vortex manner which favors excitation of spherical plasmas.

The resonant cavity 31 is also provided with a vacuumizing interface which is communicated with a vacuum pump 312 through a pipe. The vacuumizing interface is provided with two film type vacuum gauges 313, one of the film type vacuum gauges 313 is used for measurement of vacuum of the cavity, and the other film type vacuum gauge 313 is used for measurement of a process pressure after the equipment operates. A process pressure gauge may be linked with the proportioning valve 318 to control any stable pressure of the cavity within a measuring range.

Figure 4:
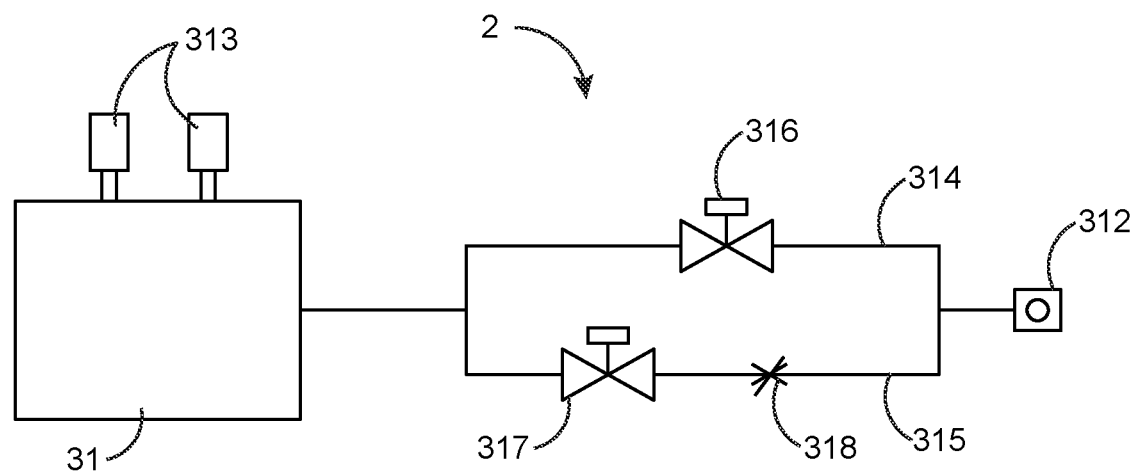
FIG. 4 shows a structural diagram of a vacuum pressure control device of the microwave plasma chemical vapor deposition device in accordance with the preferred embodiment of the present invention.
Figure 5:
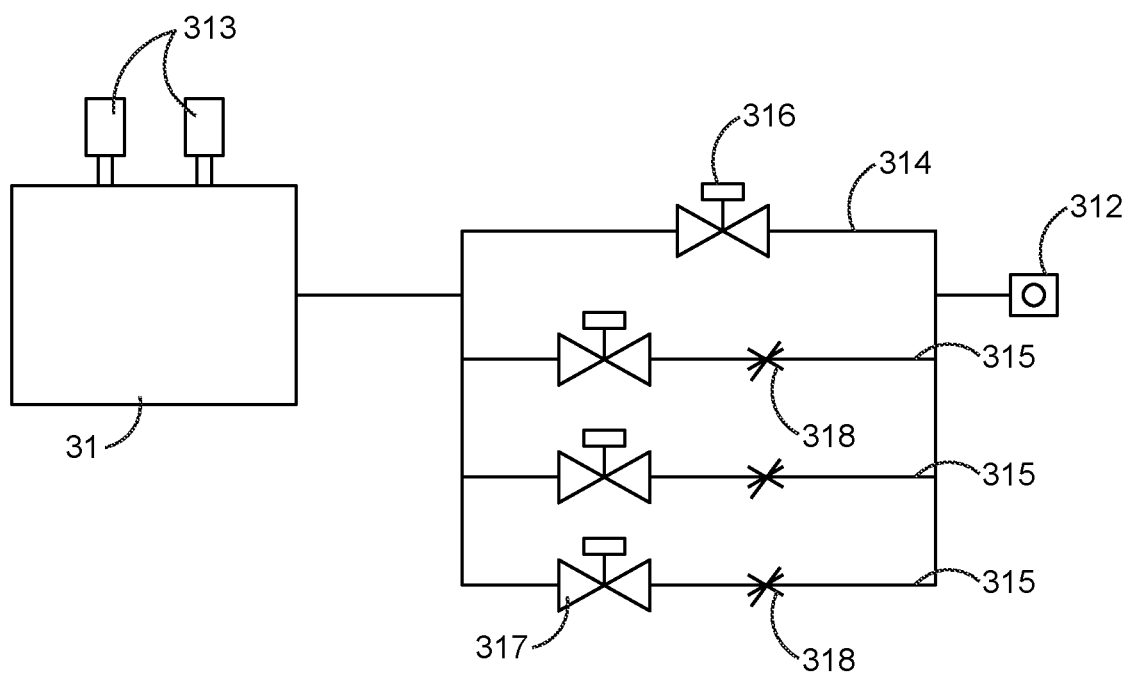
FIG. 5 shows a structural diagram of another configuration of the vacuum pressure control device in accordance with the preferred embodiment of the present invention.

As shown in combination with FIG. 4 and FIG. 5, at least one first vacuum pipe 314 and at least one second vacuum pipe 315 are communicated between the vacuumizing interface and a vacuum pump 312. Each of the first vacuum pipe 314 is provided with a valve 316 and each of the second vacuum pipe 315 is provided with a valve 317 and the proportioning valve 318 wherein the diameter of the first vacuum pipe is larger than that of the second vacuum pipe.

Figure 6:
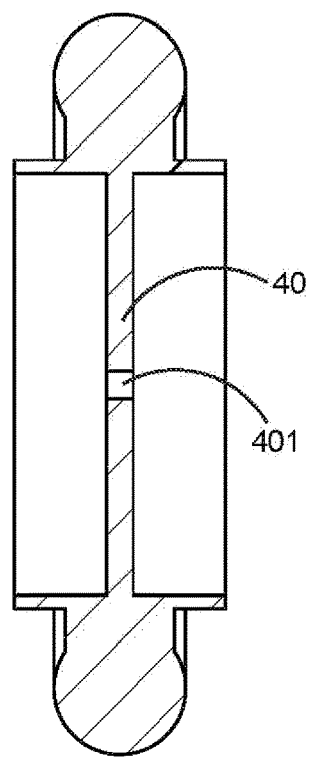
FIG. 6 shows a structural diagram of a proportioning valve of the microwave plasma chemical vapor deposition device in accordance with the preferred embodiment of the present invention.

As shown in combination with FIG. 5, in a preferred embodiment, the first vacuum pipe 314 and a plurality of second vacuum pipes 315 are connected in parallel. As shown in further combination with FIG. 6, the proportioning valves 318 are seal plates 40 provided with through holes 401, in a different second vacuum pipe, the numbers or diameters of the through holes of the proportioning valve 318 are different.

Figure 3:
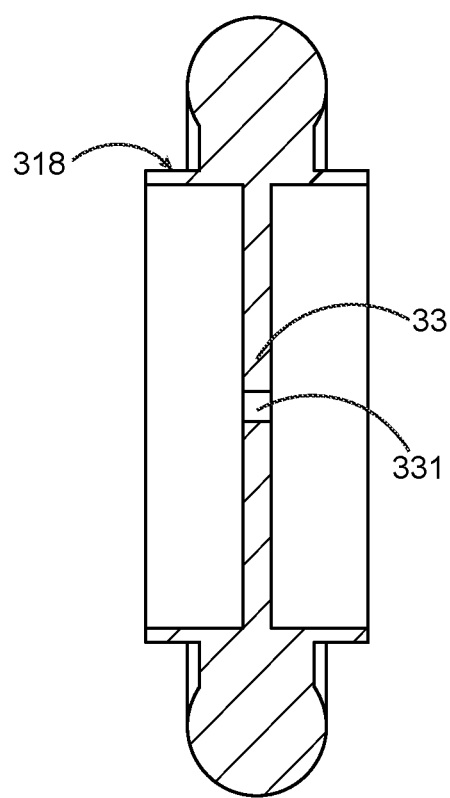
FIG. 3 shows a sectional view of a seal plate of the microwave plasma chemical vapor deposition device in accordance with the preferred embodiment of the present invention.

In this embodiment, design of a plurality of different small hole branches may achieve regulation at different pressures, providing a large cost savings. The vacuum pipe is provided with a proportioning valve 318 which is a seal plate 33 as shown in FIG. 3 provided with an air hole 331.

In a preferred embodiment, the valves 316 and 317 are pneumatic baffle valves. In the present application, the pressure in the cavity is subjected to vacuumizing using a small hole, the size of the small hole ranges from 0.5 to 1 mm in diameter which can well control the pressure in the cavity thereby changing complicated circumstances controlled by linking of the traditional proportioning valve 318 and a pressure gauge and greatly saving cost.

It should be noted that by adopting a pressure control method based on a small hole structure, the precision of its dynamic pressure can be greatly improved. Experiment data shows that when the pressures are set at 20 torr, 30 torr, 50 torr, 100 torr and 150 torr, its actual measurement values are 20.5 torr, 30.5 torr, 50.5 torr, 100.5 torr and 150.5 torr, with the error being 0.5 torr, and therefore its precision is greatly improved, and these requirements of a diamond chemical vapor deposition device on ultrahigh vacuum and stability are satisfied.

In other embodiments, the number of the air holes and the sizes of the air holes can be regulated according to vacuum pressure requirements.

The working principle and the process of the above microwave plasma chemical vapor deposition device 1 are as follows: at first, the resonant cavity 31 is vacuumized. A plurality of process gases including methane and hydrogen is introduced into the resonant cavity 31. Then a microwave is generated by the microwave source 10. The microwave generated by the microwave source 10 is spread in the TE10 mode in the first waveguide and is spread in the TEM mode in the second waveguide 25 after being converted via the mode conversion antenna 21. The microwave signal in the TEM mode is converted into the TM01 mode again via the mode conversion antenna 21 after entering the coupling conversion cavity 22 and enters into the resonant cavity 31 via the medium viewport 23. The methane above the deposition station 32 forms active carbon containing groups and atomic hydrogen and forms spherical plasma 34 thereby depositing and obtaining the diamond film on the upper surface of a seed.

In a preferred embodiment, the deposition station 32, as an independent component, may directly undergo vacuum degree detection through the VCR joint. In this embodiment, leak detection is performed by adopting helium after vacuumizing via the VCR joint.

Figure 8:
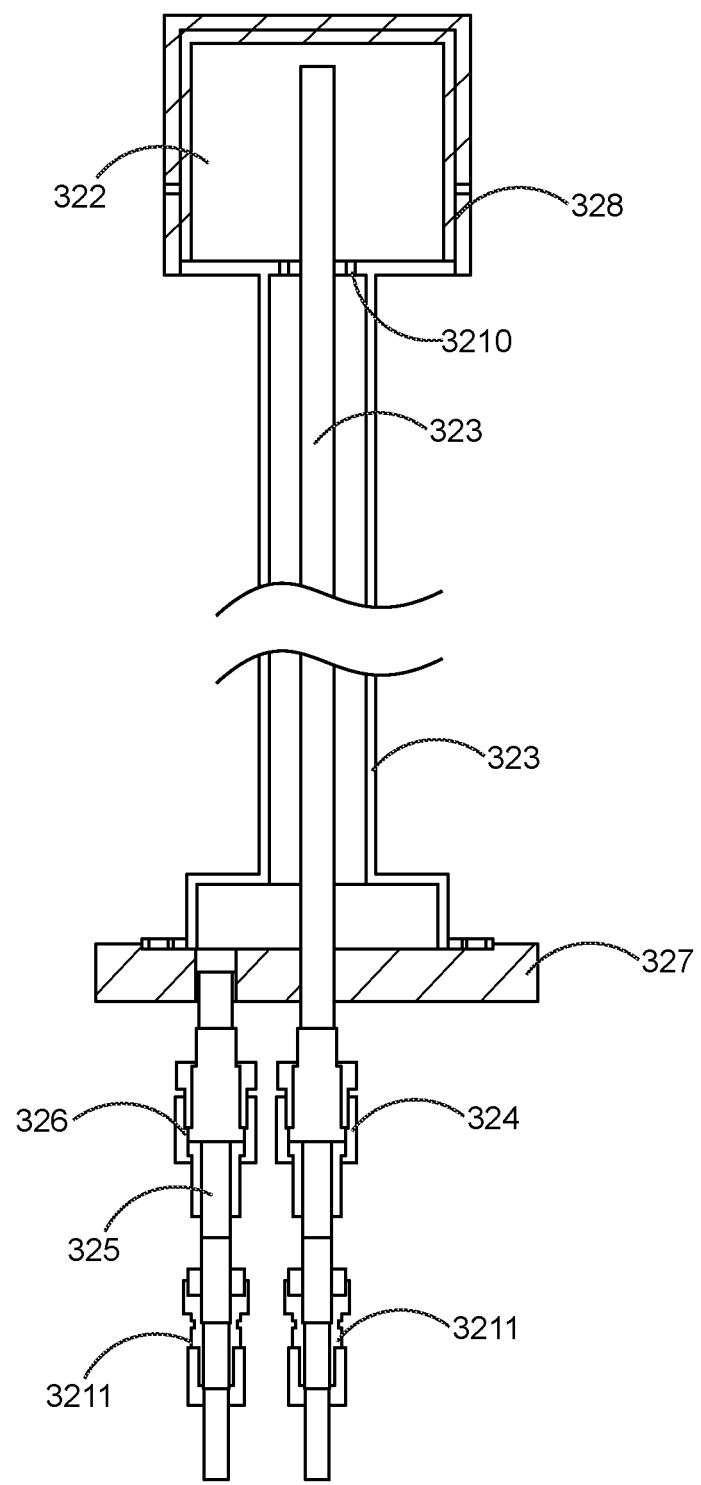
FIG. 8 shows a structural diagram of a diamond deposition station of the microwave plasma chemical vapor deposition device in accordance with the preferred embodiment of the present invention.

In one embodiment, the cooling water circuit comprises a cooling water chamber 322 and a water cooling shaft 323 as shown in FIG. 8. One end of the water cooling shaft 323 is communicated to the cooling water chamber 322 and the other end of the water cooling shaft 323 extends to the exterior of the resonant cavity 31.

Further, the water cooling shaft 323 is provided with a first VCR joint 324 and the first VCR joint 324 is arranged on the exterior of the resonant cavity 31.

Further, a water outlet pipe 325 is also included. The water outlet pipe 325 is communicated to the cooling water chamber 322. The water outlet pipe 325 is provided with a second VCR joint 326 and the second VCR joint 326 is arranged on the exterior of the resonant cavity 31.

The deposition station 32 comprises a flange 327 sealed with the resonant cavity 31 and the water cooling shaft 323 is fixed on the flange 327. Further, the cooling water circuit comprises a water ring heat conductive bush 328 and an upright bush 329.

The water ring heat conductive bush 328 acts on one surface of the substrate 33. The water cooling shaft 323 is communicated to the water ring heat conductive bush 328. The upright bush 329 is connected between the water ring heat conductive bush 328 and the flange 327 and the water ring heat conductive bush 328 and the upright bush 329 are communicated through cooling water return ports 3210.

In one embodiment, the upright bush 329 is sleeved outside the water cooling shaft 323.

In the, preferred embodiment, the water cooling shaft 323 directly introduces cooling water into the water ring heat conductive bush 328, so that the cooling water directly acts on a non-working surface of the substrate 33 for cooling the substrate 33. The upright bush 329 is supported between the water ring heat conductive bush 328 and the flange 327, which, on one hand, takes a support effect, and on the other hand, may constitute a part of the cooling water circuit. A first cavity formed by the water ring heat conductive bush 328 and a second cavity surrounded between the upright bush 329 and the water cooling shaft 323 jointly constitute the cooling water circuit. The water outlet pipe is fixed on the flange 327 and may be communicated with the second cavity.

In the preferred embodiment, the first cavity and the second cavity are communicated through the cooling water return ports. The cooling water return ports are preferably a plurality of through holes distributed in an array, in such a way, the flow speed of the cooling water from the first cavity to the second cavity may be controlled so that the cooling water sufficiently exchanges heat with the substrate and then is discharged out.

In one embodiment, the water cooling shaft 323 and the water outlet pipe 325 are respectively provided with water pipe joints 3211 and are communicated with the exterior water tank through the water pipe joints to form a circulating waterway.

The preferred embodiment provides a synthesis method of a single crystal diamond. The single crystal diamond synthesis method comprising performing leveling treatment such as mechanical lapping on the surface of the diamond seed to polish the surface of seed or substrate. Next, an acid treatment is performed in which a temperature is raised to an optimum temperature value ranging from 100 to 130 degrees Celsius with heated water-sulfuric acid and hydrogen in a ratio of 1:5:1 and washed for 10 to 20 minutes. Then, the seed is rinsed with deionized water for about 10 to 15 minutes. Thereafter, an ultrasonic treatment is performed by ultrasonically washing the seed for 30 minutes in an organic solvent such as isopropanol. Next, the seed is rinsed with deionized water for 6 to 10 minutes. Then, a temperature of a dust-free oven is raised to 80 degrees Celsius in order to bake for 10 to 30 minutes. Upon baking, the resonant cavity is opened and the seed is fixed on the upper surface of the deposition station. Next, the cavity is closed. Thereafter, a low-pressure vacuumizing is performed in the first waveguide. Next, a water cooling shaft is adjusted to a proper position to control the temperature of the seed. The resonant cavity is then washed with high-purity hydrogen once or many times. For example, once washing and vacuumizing is performed to 0.0015 Torr, hydrogen is increased to 5 Torr and the air pressure in the cavity is controlled to be stabilized at 5 Torr.

The microwave source is opened, and a three-needle tuner is adjusted to excite the resonant cavity to perform plasma ignition. Plasma ignition generally occurs at 5 to 10 torr.

Then, power is increased according to a Table 1 as below. The power is increased by adjusting the air pressure and ensuring that the plasmas are not lost through power and air pressure coupling adjustment.

TABLE 1

| | Plasma power | | | | | | |
|---|---|---|---|---|---|---|---|
| | 600 w | 1000 w | 1500 w | 2000 w | 2500 w | 3000 w | 3500 w~8000 w |
| Air pressure | 10 torr | 20 torr | 50 torr | 100 torr | 120 torr | 150 torr | 150 torr |

Then, the microwave power and the position of the water cooling shaft are slightly adjusted, and the temperature of the seed is controlled through a double-color sensor. The surface of the seed is then etched with hydrogen for 15 minutes. Thereafter, the temperature of the seed is controlled to 800 to 1400 degrees Celsius. The process gases with a quantity of 50 scmm methane and 500 sccn hydrogen are introduced and the diamond is enabled to persistently grow. Finally, the resonant cavity 31 is opened after the growth of the diamond is completed.

Figure 10:
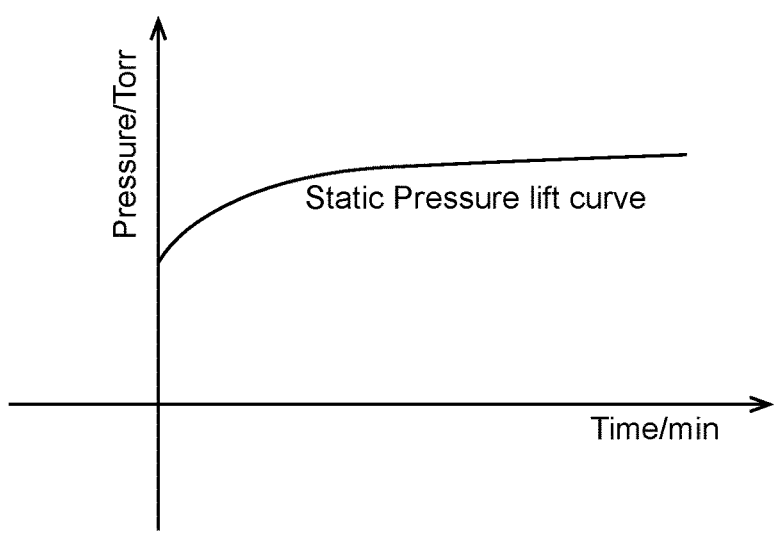
FIG. 10 shows a diagram of a static pressure lift curve of the microwave plasma chemical vapor deposition device in accordance with the preferred embodiment of the present invention.

As shown in combination with FIG. 10, in order to improve the vacuum degree of the resonant cavity 31 of the microwave plasma chemical vapor deposition device 1, the present embodiment provides a control method of extremely-high vacuum. The control method comprises the steps of, establishing a static pressure lift curve as shown in FIG. 10 of the vacuum cavity, wherein, an x coordinate represents time, and a y coordinate represents pressure, and controlling conditions:

1) an initial point of the curve being less than $1.0 \times 10^{-11}$ Pa, 2) a tangent slope of the curve being less than $10 \times 10^{-8}$ pa/min, and 3) a total leak rate of the vacuum cavity being less than $10 \times 10^{-8}$ pa·l/min.

In order to ensure the tightness of the vacuum cavity, the following conditions are satisfied:

1. the surface finish of the inner wall of the cavity is increased to Ra0.4, good finish may well solve the air release problem of the material in use.

2. baking of the side wall material of the cavity may also limitedly solve the air release problem of the cavity material, which is represented as virtual leak in the static pressure lift curve.

Figure 9:
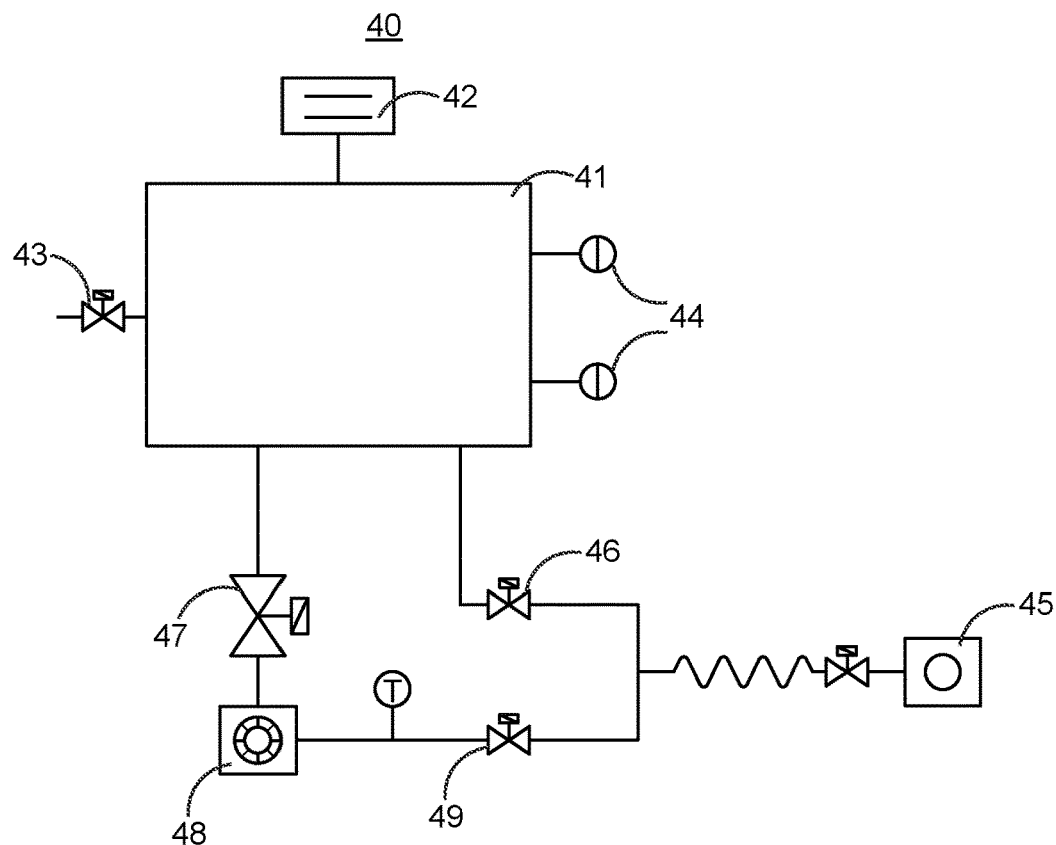
FIG. 9 shows a principle diagram of a vacuumizing system of the microwave plasma chemical vapor deposition device in accordance with the preferred embodiment of the present invention.

As shown in combination with FIG. 9, in one embodiment, an ultrahigh vacuumizing system 40 is provided, comprising a Zr—Al getter pump 42, a release valve 43 and 2 film vacuum gauges 44 which are arranged on a vacuum cavity 41 (for example the resonant cavity), a rough vacuum pipe and a fine vacuum pipe are also arranged between the vacuum cavity 41 and a mechanical pump dry pump 45, wherein the rough vacuum pipe is provided with a rough valve 46, and the fine vacuum pipe is successively provided with an ultra-high vacuum valve 47, a turbo molecular pump 48 and a foreline valve 49.

In this embodiment, 10E-11 Pa of extremely-high vacuum may be obtained by applying the Zr—Al getter pump as an auxiliary sucking pump.

In one embodiment, a vacuum testing method of the microwave plasma chemical vapor deposition device comprises the steps:

(1) performing helium leak detection on each component, and performing a static pressure lift test;

(2) making tooling and performing helium leak detection on the water cooling shaft, and performing the static pressure lift test;

(3) performing helium leak detection on a whole system, and performing the static pressure lift test;

(4) vacuumizing to $1.0 \times 10E-11$ Pa;

(5) closing valves, and performing the static pressure lift test;

(6) recording a pressure value every 1 minute; and (7) defining a standard curve and analyzing whether the cavity is qualified.

Figure 11:
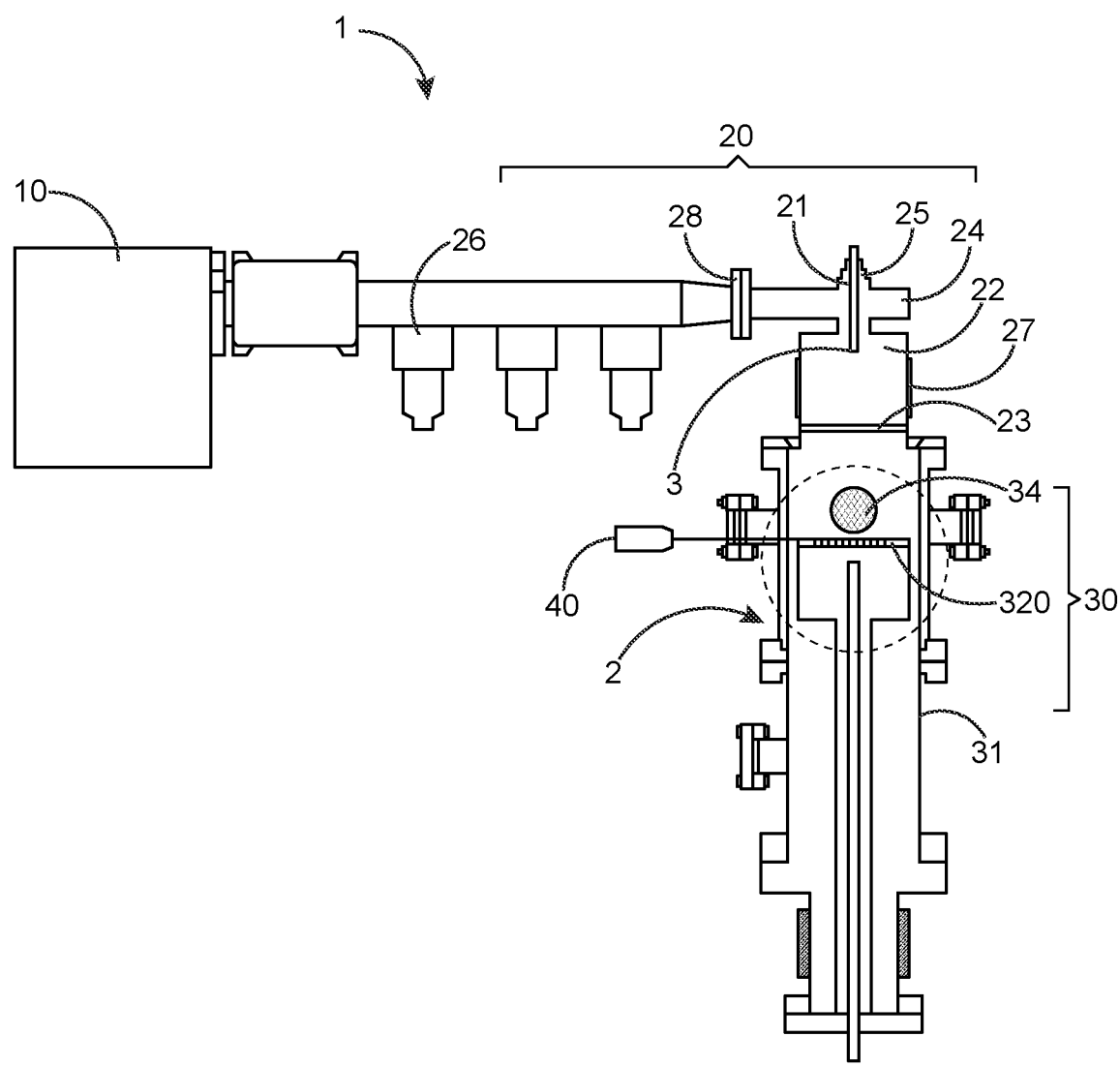
FIG. 11 shows another configuration of the microwave plasma chemical vapor deposition device in accordance with the preferred embodiment of the present invention.
Figure 12:
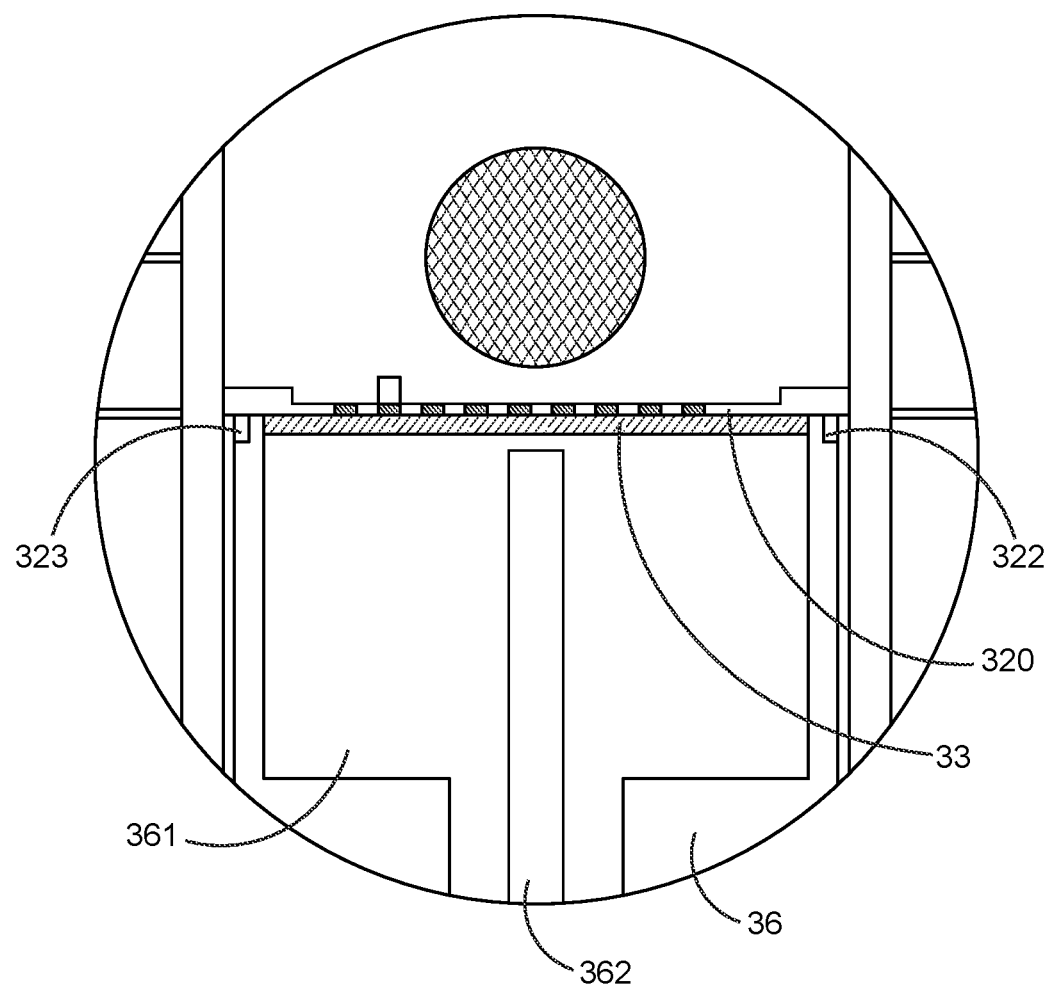
FIG. 12 shows a partially enlarged view of A in FIG. 11 in accordance with the preferred embodiment of the present invention.

Another configuration of the preferred embodiment is shown in FIG. 11. The resonant device 30 comprises a resonant cavity 31 in which a reflection plate 320 and a substrate 33 are arranged from top to bottom. Both the reflection plate 320 and the substrate 33 are horizontally arranged as shown in FIG. 12.

Figure 13:
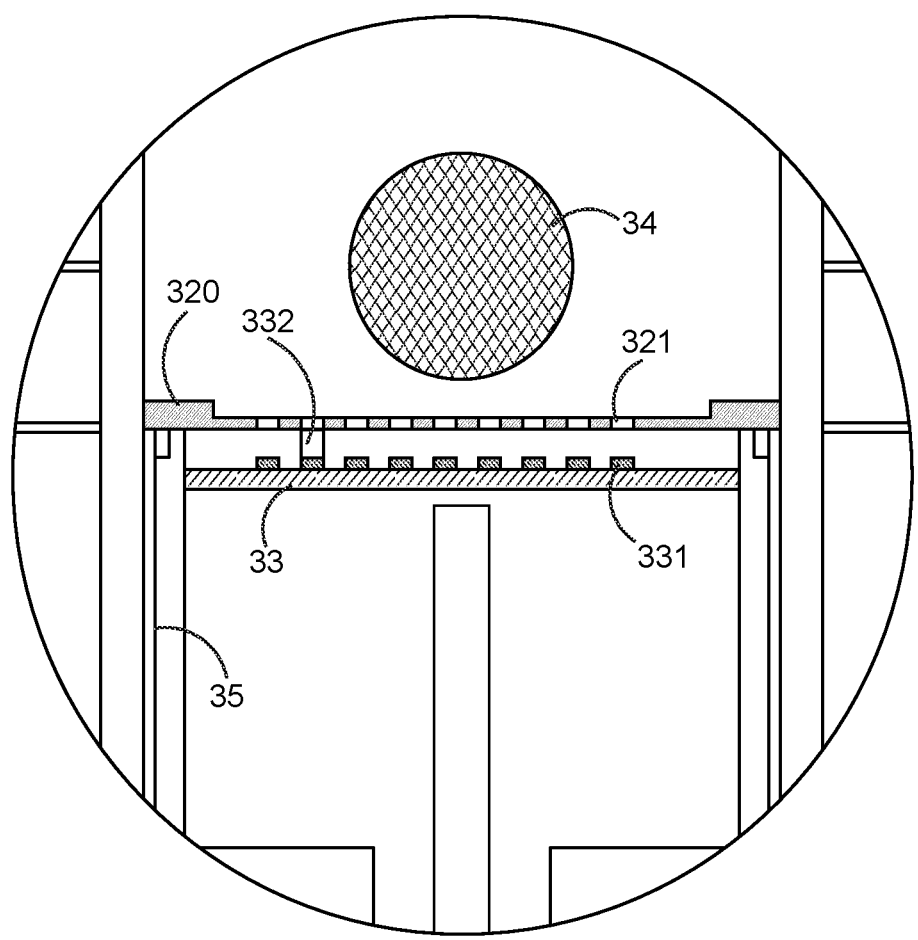
FIG. 13 shows a state diagram of the microwave plasma chemical vapor deposition device after a reflection plate and a substrate are moved in accordance with the preferred embodiment of the present invention.

As shown in combination with FIG. 13, at least one viewport 321 is hollowed on the reflection plate 320 and the surface of the reflection plate 320 at least deviated from the substrate 33 is an electromagnetic wave reflection surface. One side of the substrate 33 facing to the viewport is a diamond growth side.

In one embodiment, both the electromagnetic wave reflection surface and the diamond growth side face upward. The reflection plate 320 is arranged above the substrate 33. The plasma coupling device 20 is located above the reflection plate 320 and can couple microwaves from the microwave source 10 above the reflection plate 320 to form a plasma 34.

In this embodiment, the electromagnetic wave reflection surface is used for reflecting electromagnetic waves and the position of the excited plasma in a vertical direction may be adjusted when the electromagnetic wave reflection surface is moved up and down.

The viewport 321 formed by hollowing on the reflection plate 320 is used for exposing partial diamond growth side so as to form a homoepitaxial diamond on the diamond growth side.

Figure 14:
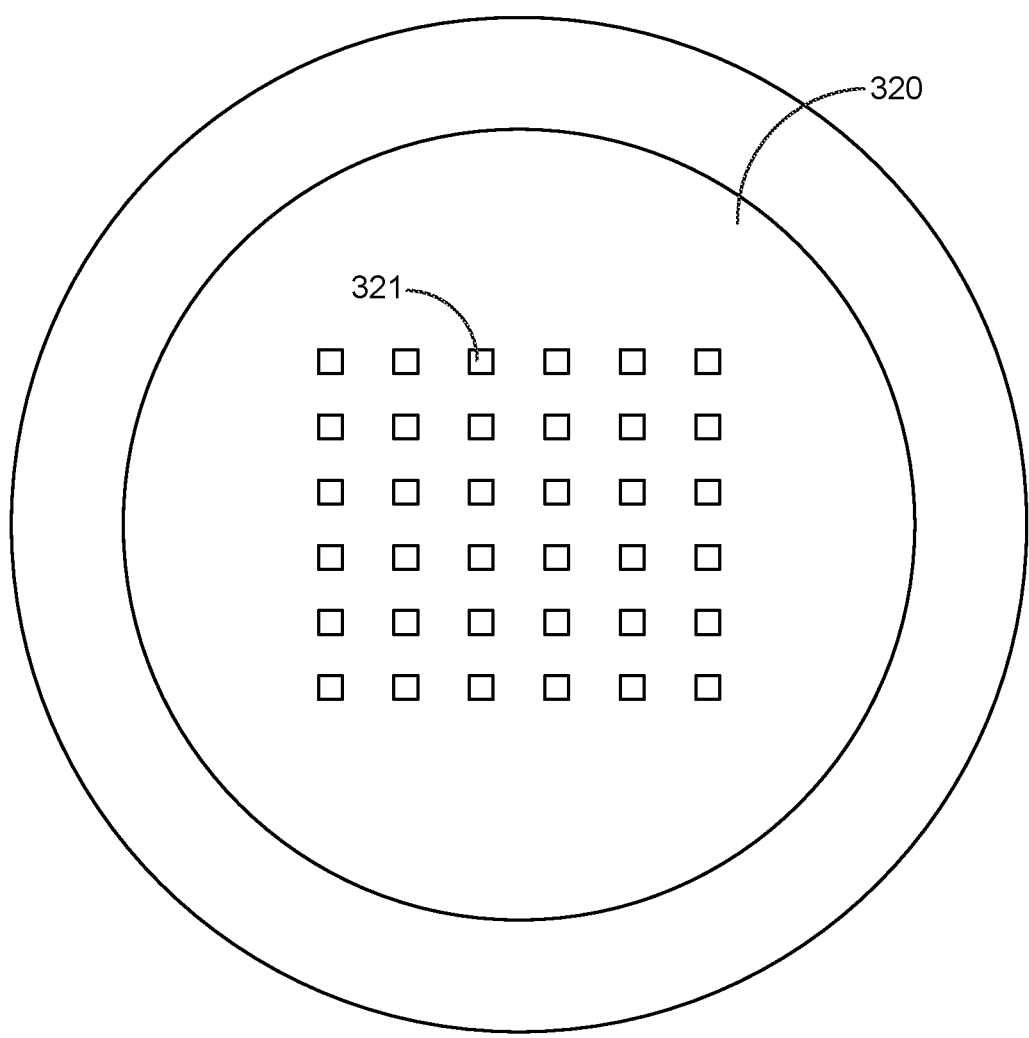
FIG. 14 shows a top view of a reflection plate of the microwave plasma chemical vapor deposition device in accordance with the preferred embodiment of the present invention.

In a preferred embodiment, a plurality of viewports 321 as shown in FIG. 14 is distributed on the reflection plate 320 in an array to form a mesh plate structure.

At least one seed 331 is protruded on the surface of the substrate 33 and each of the seeds 331 respectively corresponds to the interior of one viewport.

In this technical solution, the top surface of the seed is used for providing a film-coating surface depositing a diamond film 332. In other embodiments, the seed may also be replaced with an alumina substrate and the like.

In one embodiment, the height of the seed is larger than that of the viewport, and the upper surface of the seed convexly extends from the upper surface of the reflection plate 320 after the reflection plate 320 is laminated with the substrate.

A gap is formed between the side surface of the seed and the viewport to ensure that no interference occurs between the seed and the viewport in the process of up and down movement of the seed or the reflection plate 320.

In one embodiment, the microwave plasma chemical vapor deposition device 1 comprises a first lifting device 35 connected to the reflection plate 320. The first lifting device 35 drives the reflection plate 320 to be moveable up and down in the resonant cavity 31.

Further, the first lifting device 35 forms three-point support with and the bottom surface of the reflection plate 320, and the positions of the three points are arrayed triangularly.

In this embodiment, the reflection plate 320 is ensured to be kept in horizontal plane support through three-point support.

In a preferred embodiment, three-point support positions are arrayed in an equilateral triangle and support points are located on the bottom edge of the reflection plate 320.

In a preferred embodiment, the first lifting device comprises three support rods extending in a vertical direction. One end of the support rods acts on the bottom surface of the reflection plate 320 and the other ends extend out of the exterior of the resonant cavity. The movement of the reflection plate 320 in the vertical direction is achieved by driving the bottoms of the support rods.

In this technical solution, manners of three-point support and support rods are adopted so that in one hand, the reflection plate 320 may be ensured to be horizontally supported and on the other hand, a space surrounded by three support rods may also be used for placement of the substrate and up-down movement of the substrate and does not influence the movement of the substrate.

Further, a second lifting device connected to the substrate 33 is included. The second lifting device drives the substrate to be moveable up and down in the resonant cavity.

In one embodiment, a first cooling device 36 for cooling the substrate 33 is also included.

Further, the first cooling device 36 comprises a cooling water chamber 361 and a water cooling shaft 362 as shown in FIG. 12. The cooling water chamber 361 is supported under the substrate 33. One end of the water cooling shaft 362 is communicated to the cooling water chamber 361 and the other end extends to the exterior of the resonant cavity 31.

In this embodiment, the water cooling shaft is communicated with exterior cooling water and forms a circulating water cooling circuit with the cooling water chamber and the cooling water exchanges heat with the substrate and then is output to the exterior of the resonant cavity.

In one embodiment, an expansion bellows 311 is also included which constitutes one part of the resonant cavity 31.

In a preferred embodiment, the cooling water cavity is supported between the substrate and the bottom surface of the resonant cavity. In one embodiment, the water cooling shaft is fixed on a CF flange at the bottom of the resonant cavity. When it is needed to adjust the vertical height of the substrate, the CF flange is driven to be moved up and down. The expansion bellows is compressed or extended so as to drive the water cooling shaft. The cooling water chamber and the substrate are integrally moved up and down to ensure the vacuum degree of the resonant cavity in the process of movement.

In a preferred embodiment, the expansion bellows is an expansion metal bellows. In this embodiment, the first cooling device constitutes the second lifting device while achieving water cooling.

In a preferred embodiment, both the materials of the reflection plate 320 and the substrate 33 are molybdenum. In one embodiment, the second cooling device for cooling the reflection plate 320 is included. In a preferred embodiment, the second cooling device adopts a cooling water circulating circuit.

In one embodiment, a cooling water pipe is formed in the reflection plate 320, a cooling water outlet 322 and a cooling water inlet 323 are formed in the bottom end of the reflection plate 320, and the cooling water outlet 322 and the cooling water inlet 323 as well as cooling water at the exterior of the resonant cavity constitute a circulating waterway.

In one embodiment, a laser measuring instrument 40 is included, which corresponds to the seed and is used for measuring the thickness of the diamond growing on a seed surface.

In this embodiment, adjustment of the height of the reflection plate may adjust the height of a plasma sphere. In the process of persistent growth of the diamond, the height of the upper surface of the seed is persistently measured on line through the laser measuring instrument, correspondingly, a seed growth substrate is automatically adjusted to automatically descend. The position of the upper surface of the diamond relative to the plasma may be kept unchanged. A problem existing in the process of diamond production can be effectively solved so that the diamond grows at a stable environment to extremely improve the quality of the diamond.

Figure 15:
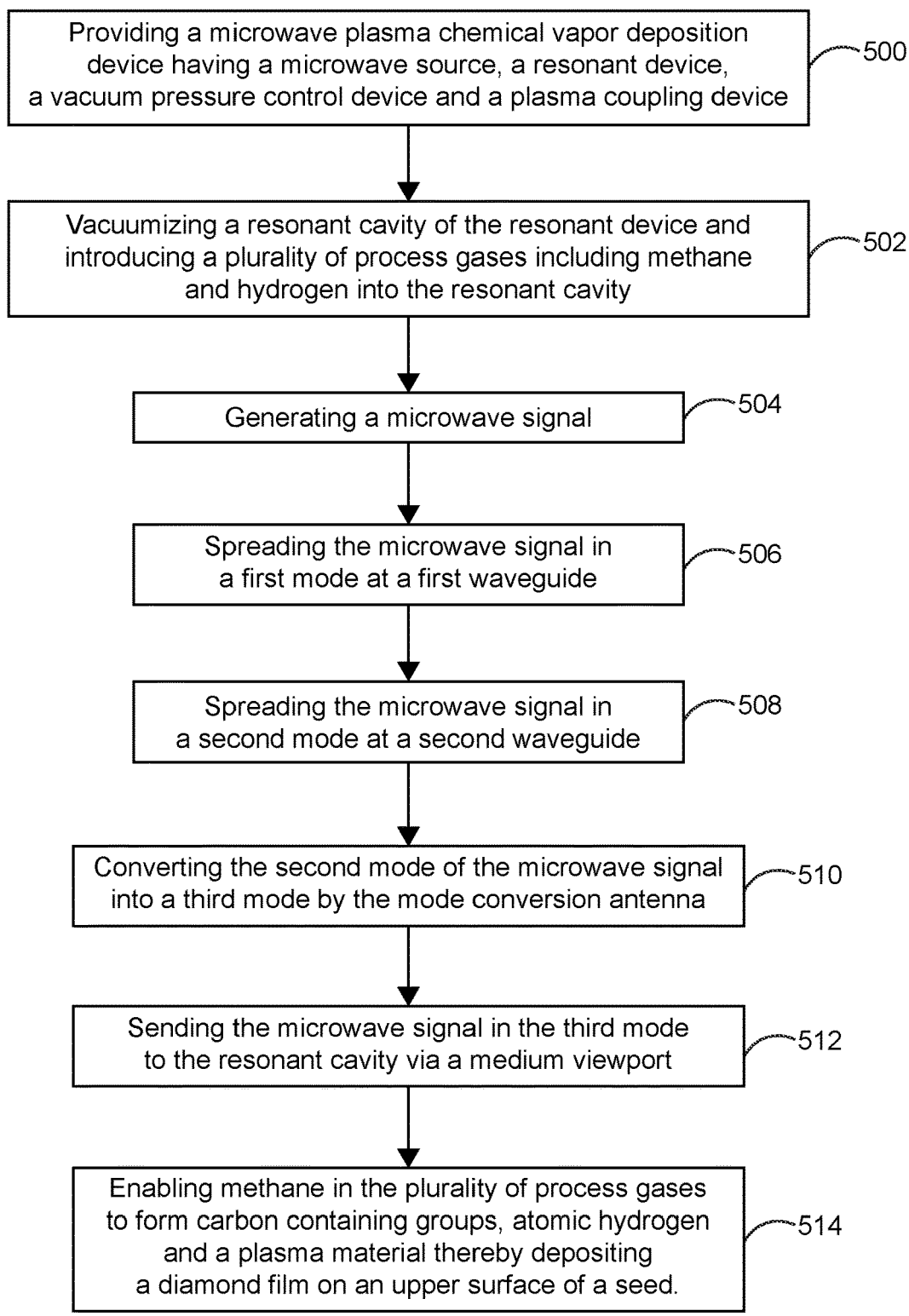
FIG. 15 shows a flowchart of a method for synthesizing the diamond film utilizing the microwave plasma chemical vapor deposition device in accordance with the preferred embodiment of the present invention.

FIG. 15 shows a flowchart of a method for synthesizing the diamond film utilizing the microwave plasma chemical vapor deposition device. The method commences by: providing the microwave plasma chemical vapor deposition device as shown in block 500. Next, the resonant cavity is vacuumized and the plurality of process gases including but not limited to methane and hydrogen are introduced into the resonant cavity as shown in block 502. The microwave signal is generated by the microwave source as shown in block 504.

The microwave signal in the first mode is spread at the first waveguide as shown in block 506. The microwave signal in the second mode is spread at the second waveguide after being converted via the mode conversion antenna as shown in block 508. The second mode of the microwave signal is converted into the third mode by the mode conversion antenna after transmitting to the coupling conversion cavity via the second waveguide as shown in block 510. The microwave signal in the third mode is sent to the resonant cavity via the medium viewport at the plasma coupling device as shown in block 512. The methane in the plurality of process gases above the deposition station is excited and discharged to form carbon containing groups, atomic hydrogen and the plasma material at an optimum voltage and pressure condition thereby depositing and obtaining the diamond film on the upper surface of the seed as shown in block 514.

The foregoing description of the preferred embodiment of the present invention has been presented for the purpose of illustration and description. It is not intended to be exhaustive or to limit the invention to the precise form disclosed. Many modifications and variations are possible in light of the above teachings. It is intended that the scope of the present invention not be limited by this detailed description, but by the claims and the equivalents to the claims appended hereto.

What is claimed is:

1. A microwave plasma chemical vapor deposition device, comprising:
   a microwave source to generate a microwave signal;
   a resonant device having a resonant cavity and a deposition station, the resonant cavity adaptable to receive a plurality of process gases including methane and hydrogen;
   a vacuum pressure control device to vacuumize the resonant cavity, the vacuum pressure control device including a first vacuum pipe and a second vacuum pipe;
   a plasma coupling device comprising:
      a waveguide connected to the microwave source, the waveguide including a first waveguide and a second waveguide, the microwave signal being spread in a first mode at the first waveguide, the second waveguide arranged perpendicularly to the first waveguide;
      a mode conversion antenna connected to the waveguide, wherein the mode conversion antenna converts the first mode of the microwave signal into a second mode being spread at the second waveguide;
      wherein the mode conversion antenna is a plasma antenna including an inert gas sealed in a quartz tube and high voltage electrodes arranged at two ends of the inert gas;
      a coupling conversion cavity receives and transmits the microwave signal in the second mode to the mode conversion antenna contained in the coupling conversion cavity under a controlled temperature via the second waveguide connected between a top end of the coupling conversion cavity and the first waveguide, thereby converting the second mode of the microwave signal into a third mode, and wherein the working pressure of the resonant cavity ranges from $1.3 \times 10^{-5}$ Pa to $1.3 \times 10^{-10}$ Pa; and
      a medium viewport in communication with the third mode of the microwave signal, the third mode of the microwave signal excites and discharges the plurality of process gases in the resonant cavity above the deposition station to form spherical plasmas, carbon containing groups and atomic hydrogen at an optimum voltage and pressure condition thereby depositing and obtaining a diamond film on an upper surface of a seed.

2. The microwave plasma chemical vapor deposition device of claim 1 wherein the third mode of the microwave signal enables a region above the deposition station to form an electromagnetic field, thereby preventing a side wall of the resonant cavity from polluting the deposited diamond film.

3. The microwave plasma chemical vapor deposition device of claim 1 wherein the microwave signal first mode is TE10 mode, the second mode is TEM mode and the third mode is TM01 mode.

4. The microwave plasma chemical vapor deposition device of claim 1 wherein the optimum voltage applied to two ends of the mode conversion antenna ranges between 1000V and 1200V.

5. The microwave plasma chemical vapor deposition device of claim 1 wherein the plurality of process gases is excited and discharged in the resonant cavity to form spherical plasmas.

6. The microwave plasma chemical vapor deposition device of claim 1 wherein the microwave signal is between 6 kW to 10 kW of power and a frequency of around 2.45 GHz.

7. A microwave plasma chemical vapor deposition device to synthesize a diamond film, comprising:
   a microwave source to generate a microwave signal;
   a resonant device having a resonant cavity and a deposition station, the resonant cavity being adaptable to receive a plurality of process gases including methane and hydrogen;
   a vacuum pressure control device designed to vacuumize the resonant cavity, the vacuum pressure control device includes a first vacuum pipe and a second vacuum pipe;
   a plasma coupling device comprising:
   a waveguide connected to the microwave source including a first waveguide and a second waveguide, the microwave signal being spread in a TE10 mode at the first waveguide;
      a mode conversion antenna connected to the waveguide, the mode conversion antenna converting the TE10 mode of the microwave signal into a TEM mode being spread at the second waveguide;
      wherein the mode conversion antenna is a plasma antenna including an inert gas sealed in a quartz tube and high voltage electrodes arranged at two ends of the inert gas;
      a tuner for adjusting the wave forms of the transmitted microwave signal arranged between the first waveguide and the microwave source;
      a transition waveguide arranged between the tuner and the first waveguide;
      a coupling conversion cavity arranged above the resonant cavity and containing the mode conversion antenna, the coupling conversion cavity receiving and transmitting the microwave signal in the TEM mode to the mode conversion antenna under controlled temperature via the second waveguide thereby converting the TEM mode of the microwave signal into a TM01 mode; and
      a medium viewport located between the resonant cavity and the coupling conversion cavity, wherein the medium viewport receives the microwave signal in the TM01 mode and sends to the vacuumized resonant cavity which enables methane above the deposition station to form carbon containing groups, atomic hydrogen and spherical plasma utilizing an optimum voltage level, thereby depositing and obtaining the diamond film on an upper surface of a seed; and wherein the working pressure of the resonant cavity ranges from $1.3 \times 10^{-5}$ Pa to $1.3 \times 10^{-10}$ Pa.

* * * * *